(12) United States Patent
Hernandez-Garcia et al.

(10) Patent No.: US 8,791,699 B2
(45) Date of Patent: Jul. 29, 2014

(54) SIMULTANEOUS ASL/BOLD FUNCTIONAL MRI

(75) Inventors: Luis Hernandez-Garcia, Ann Arbor, MI (US); Jennifer Vannest, Cincinnati, OH (US); Scott Holland, Cincinnati, OH (US); Vincent Schmithorst, Batavia, OH (US)

(73) Assignee: Children's Hospital Medical Center, Cincinnati, OH (US)

( * ) Notice: Subject to any disclaimer, the term of this patent is extended or adjusted under 35 U.S.C. 154(b) by 650 days.

(21) Appl. No.: 13/118,943

(22) Filed: May 31, 2011

(65) Prior Publication Data
US 2012/0139537 A1 Jun. 7, 2012

Related U.S. Application Data

(60) Provisional application No. 61/350,053, filed on Jun. 1, 2010.

(51) Int. Cl.
*G01R 33/563* (2006.01)
*G01R 33/48* (2006.01)

(52) U.S. Cl.
CPC ...... *G01R 33/56366* (2013.01); *G01R 33/4806* (2013.01)
USPC ............ 324/309; 324/306; 324/307; 324/318

(58) Field of Classification Search
CPC ................... G01R 33/56366; G01R 33/4806
USPC .......... 324/300–322; 600/407–435, 322, 557; 382/128–131; 128/203.14, 203.25, 128/204.23, 204.26; 514/456; 702/19
See application file for complete search history.

(56) References Cited

U.S. PATENT DOCUMENTS

| 7,462,155 | B2 * | 12/2008 | England ........................ 600/557 |
| 8,151,795 | B2 * | 4/2012 | Fishman et al. ......... 128/204.26 |
| 8,459,258 | B2 * | 6/2013 | Slessarev et al. ........ 128/203.25 |
| 8,463,552 | B1 * | 6/2013 | Black et al. ..................... 702/19 |
| 8,571,634 | B2 * | 10/2013 | Hubbard ........................ 600/419 |
| 2005/0154290 | A1 * | 7/2005 | Langleben .................... 600/410 |
| 2008/0161386 | A1 * | 7/2008 | French et al. ................. 514/456 |
| 2009/0120435 | A1 * | 5/2009 | Slessarev et al. ........ 128/203.14 |
| 2009/0253982 | A1 * | 10/2009 | Wang ............................ 600/419 |
| 2009/0320845 | A1 * | 12/2009 | Fishman et al. ......... 128/204.23 |
| 2010/0204563 | A1 * | 8/2010 | Stodilka et al. ............... 600/411 |

(Continued)

OTHER PUBLICATIONS

Wang, Jiongjiong, et al., "Comparison of quantitative perfusion imaging using arterial spin labeling at 1.5 and 4.0 tesla," Magnetic Resonance in Medicine, Aug. 2002, vol. 48, pp. 242-254, Wiley-Blackwell, Hoboken, New Jersey, USA.

(Continued)

*Primary Examiner* — Melissa Koval
*Assistant Examiner* — Tiffany Fetzner
(74) *Attorney, Agent, or Firm* — Baker & Hostetler LLP

(57) ABSTRACT

This disclosure is generally drawn to methods, systems, appliances and/or apparati related to obtaining magnetic resonance imaging (MRI) images. More specifically, the disclosure relates to obtaining MRI images using arterial spin labeling (ASL) and blood-oxygen-level dependence functional magnetic resonance imaging (BOLD-fMRI) techniques. In some examples, a method of obtaining magnetic resonance imaging (MRI) image(s) is provided. An example method may include providing arterial spin labeling (ASL) labeling, obtaining at least one ASL acquisition after ASL labeling, and obtaining at least one blood-oxygen-level dependence functional magnetic resonance imaging (BOLD-fMRI) acquisition after ASL labeling.

34 Claims, 7 Drawing Sheets

(56) References Cited

U.S. PATENT DOCUMENTS

| | | | | |
|---|---|---|---|---|
| 2012/0139537 | A1* | 6/2012 | Holland et al. | 324/309 |
| 2012/0277572 | A1* | 11/2012 | Hubbard | 600/419 |
| 2013/0144153 | A1* | 6/2013 | Inglis et al. | 600/409 |
| 2013/0178733 | A1* | 7/2013 | Langleben | 600/419 |
| 2013/0282297 | A1* | 10/2013 | Black et al. | 702/19 |
| 2013/0340756 | A1* | 12/2013 | Slessarev et al. | 128/203.25 |
| 2014/0018649 | A1* | 1/2014 | Jespersen et al. | 600/322 |

OTHER PUBLICATIONS

Ye, Frank, Q., et al., Noise reduction in 3d perfusion imaging by attenuating the static signal in arterial spin tagging ("ASSIST"): Magnetic Resonance in Medicine, Jul. 2000, vol. 44, pp. 92-100, Wiley-Blackwell, Hoboken, New Jersey, USA.

Wang, Ze, et al., "Empirical optimization of ASL data analysis using an ASL data processing toolbox: ASLtbx," Magnetic Resonance Imaging, Feb. 2008, vol. 26, No. 2, pp. 261-269, Elsevier, Inc., Philadelphia, Pennsylvania, USA.

Wang, Jiongjiong, et al., "Empirical analyses of null-hypothesis perfusion FMRI data at 1.5 and 4 T," NeuroImage, Aug. 2003, vol. 19, pp. 1449-1462, Elsevier, Inc., Philadelphia, Pennsylvania, USA.

Wong, Eric, C., et al., "A theoretical and experimental comparison of continuous and pulsed arterial spin labeling techniques for quantitative perfusion imaging," Magnetic Resonance in Medicine, Sep. 1998, vol. 40, pp. 348-355, Wiley-Blackwell, Hoboken, New Jersey, USA.

Wang, Jiongjiong, et al., "Amplitude-modulated continuous arterial spin-labeling 3.0-T perfusion MR imaging with a single coil: feasibility study," Radiology, Apr. 2005, vol. 235, No. 1, pp. 218-228, Radiological Society of North America, Oak Brook, Illinois USA.

Alsop, David C., et al., "Multisection cerebral blood flow MR imaging with continuous arterial labeling," Radiology, Aug. 1998, vol. 208, No. 2, pp. 410-416, Radiological Society of North America, Oak Brook, Illinois USA.

Alsop, David C., et al., "Reduced transit-time sensitivity in noninvasive magnetic resonance imaging of human cerebral blood flow," Journal of Cerebral Blood Flow and Metabolism, Nov. 1996, vol. 16, No. 6, pp. 1236-1249, Nature Publishing Group, New York, New York USA.

Aquirre, G.K., et al., "Experimental design and the relative sensitivity of BOLD and perfusion fMRI," NeuroImage, Nov. 2002, vol. 15, pp. 488-500, Elsevier, Inc., Philadelphia, Pennsylvania, USA.

Buxton, Richard B., et al., "A general kinetic model for quantitative perfusion imaging with arterial spin labeling," Magnetic Resonance in Medicine, Sep. 1998, vol. 40, No. 3, pp. 383-396, Wiley-Blackwell, Hoboken, New Jersey, USA.

Asllani, Iris, et al., "An investigation of statistical power for continuous arterial spin labeling imaging at 1.5 T," NeuroImage, Feb. 2008, vol. 39, pp. 1246-1256, Elsevier, Inc., Philadelphia, Pennsylvania, USA.

Biagi, Laura, et al., "Age dependence of cerebral perfusion assessed by magnetic resonance continuous arterial spin labeling," Journal of Magnetic Resonance Imaging, Apr. 2007, vol. 25, pp. 696-702, Wiley-Blackwell, Hoboken, New Jersey, USA.

* cited by examiner

BASELINE CBF MAPS FROM AN ADULT FEMALE VOLUNTEER SUBJECT IN THE RESTING STATE

BOLD ACTIVATION MAPS FROM AN ADULT FEMALE VOLUNTEER SUBJECT LISTENING TO STORIES VS. LISTENING TO RANDOM TONES. IMAGES IN RADIOLOGIC ORIENTATION. COLORED REGIONS SIGNIFICANT WITH CORRECTED $P < 0.05$.

ASL-CBF ACTIVATION MAPS FROM AN ADULT FEMALE VOLUNTEER SUBJECT LISTENING TO STORIES VS. LISTENING TO RANDOM TONES. IMAGES IN RADIOLOGIC ORIENTATION. THE PARADIGM WAS THE SAME AS FIGURE 3. COLORED REGIONS SIGNIFICANT WITH CORRECTED $P < 0.05$.

SIMULTANEOUS ASL/BOLD FUNCTIONAL MRI

CROSS-REFERENCE TO RELATED APPLICATIONS

This application claims the benefit of U.S. Provisional Application No. 61/350,053, entitled "SIMULTANEOUS ASL/BOLD FUNCTIONAL MRI," filed on Jun. 1, 2010, the disclosure of which is incorporated herein by reference.

STATEMENT REGARDING FEDERALLY SPONSORED RESEARCH OR DEVELOPMENT

This work may be supported in part by the National Institutes of Health grant number HHSN275200900018C.

BACKGROUND

The present disclosure contemplates that, before non-invasive neuroimaging methods were widely available, knowledge about normal brain development was difficult to obtain as the classical approach, neuroanatomical observation, was limited by the low mortality of normal children. Following the introduction of computed tomography (CT) and positron emission tomography (PET), attempts to describe brain development were made. However, these techniques typically expose the subject to ionizing radiation. After the introduction of magnetic resonance imaging (MRI), normal brain development could be assessed in a more systematic fashion. MRI may provide excellent soft tissue contrast, may be repeatable, and/or has become more widely available. Consequently, normal brain development has been the focus of a growing number of MRI studies.

The present disclosure contemplates that functional brain imaging studies using functional magnetic resonance imaging (fMRI) have become common in adults and have extended to studies of normal functional brain development in children. The reduced risks associated with MRI scanning may make it feasible to use this modality to study normal brain development in healthy children and/or to examine children longitudinally using various neurocognitive stimulation paradigms. Although functional MRI may provide a powerful tool for imaging of brain functional development in children in various neurocognitive domains, with a few notable exceptions, published studies using fMRI to map normal brain development in children have examined relatively small numbers of children in non-representative age and demographic samples. For example, in a recent review of PubMed articles published in the past five years, 92% of 210 functional neuroimaging articles involving children involved adolescents 18 years or older and 98% involved sample sizes less than 15 per group. Non-representative samples, small sample sizes, variable magnet field strength, and/or non-standard methodologies utilized in these clinically motivated studies may make it difficult to generalize findings. Thus, larger-scale studies may be useful in order to make more reliable interpretations of pediatric fMRI data.

The present disclosure contemplates that functional neuroimaging with MRI at 3 Tesla may have now reached a level of technical maturity sufficient to warrant standardization of methodologies for use of this technology in large-scale, multi-site studies of normative brain development in children. Furthermore, normative reference data documenting age dependent changes in cerebral perfusion and BOLD effect may provide a fundamental building block for future studies of functional neuropathology in children using functional magnetic resonance imaging methods because abnormalities in the neural substrates of attention, language, memory, and/or other developing neurocognitive domains may be better understood against the backdrop of normal age-dependent trends in these same neural circuits. Consequently, further research regarding brain functional pathology may be set in the context of normal development of the neural circuitry supporting the corresponding neurocognitive domains. For example, the pattern of brain activity supporting sentential language processing in a 7 year old boy may look very different from that of an 18 year old girl, even in absence of language pathology or brain injury.

SUMMARY OF THE DISCLOSURE

One aspect of the present disclosure provides a method of obtaining one or more MRI images on a subject (such as a patient or a body-part of a patient) is provided. Some example methods may include providing ASL labeling, followed by obtaining ASL acquisition(s) and BOLD-fMRI acquisition(s).

Some example methods of obtaining MRI images may include simultaneous ASL/BOLD-fMRI acquisition, where the simultaneous ASL/BOLD-fMRI acquisition may include an ASL multi-slice acquisition followed by at least one BOLD-fMRI multi-slice acquisition. In some examples, the simultaneous ASL/BOLD-fMRI acquisition may include the ASL multi-slice acquisition followed by two BOLD-fMRI multi-slice acquisitions. In some examples, the ASL/BOLD-fMRI acquisition may include an acquisition of at least one whole-brain image. Some example methods may include applying spin labeling using pulsed continuous arterial spin labeling, continuous arterial spin labeling and/or pulsed arterial spin labeling.

Some example methods of obtaining MRI images may include (a) performing ASL labeling, (b) performing an ASL multi-slice acquisition, and (c) performing at least one BOLD-fMRI multi-slice acquisition following the ASL multi-slice acquisition. In some examples, operations (a)-(c) may be repeated during a stimulus period, and operations (a)-(c) may also be repeated during a control period. Some example methods may also include comparing images obtained during the stimulus period with images obtained during the control period. In some examples, the stimulus period and the control period may have substantially the same duration. In some examples, the stimulus period duration may be about 32 seconds and the control period duration may be about 32 seconds. In some examples, individual stimulus period(s) and/or an individual control period(s) may include a plurality of ASL labeled acquisitions and a plurality of sham labeled acquisitions. In some examples, the individual stimulus period(s) and/or the individual control period(s) may include 4 ASL labeled acquisition and 4 sham labeled acquisitions. In some examples, ASL labeled acquisitions may alternate with sham labeled acquisitions.

Some example methods of obtaining MRI images may include a pulse sequence including (a) an ASL label pulse, (b) a post-labeling delay, (c) an ASL multi-slice acquisition, and (d) a BOLD-fMRI multi-slice acquisition following the ASL multi-slice acquisition. In some examples, the ASL label pulse has an ASL label pulse duration of about 1.5 seconds. In some examples, the ASL label acquisition has an ASL acquisition pulse duration of about 0.5 seconds. In some examples, the ASL acquisition may include acquiring a plurality of slices (e.g., about 25 slices). In some examples, the BOLD-fMRI acquisition includes two BOLD-fMRI volume acquisitions each having a BOLD-fMRI volume acquisition time (e.g., about 1.5 seconds). In some examples, the BOLD-fMRI acquisition may include one BOLD-fMRI volume acquisition having a BOLD-fMRI volume acquisition time (e.g., about 1.3 seconds). In some examples, the BOLD-fMRI volume acquisition may include a plurality of slices (e.g., about 25 slices). In some examples, items (a)-(d) may be repeated a plurality of times during a stimulus period and a plurality of times during a control period to form a block. In some examples, items (a)-(d) may be repeated 8 times in the stimulus period and 8 times in the control period to form the block. In some examples, a block may be repeated a plurality of times (e.g., 6 times). In some examples, items (a)-(d) may be repeated at a period given by a repetition time, TR (e.g., about 4 seconds, about 7 seconds). In some examples, the ASL acquisition may occur after the BOLD-fMRI acquisition.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings.

DETAILED DESCRIPTION

Figure 1:
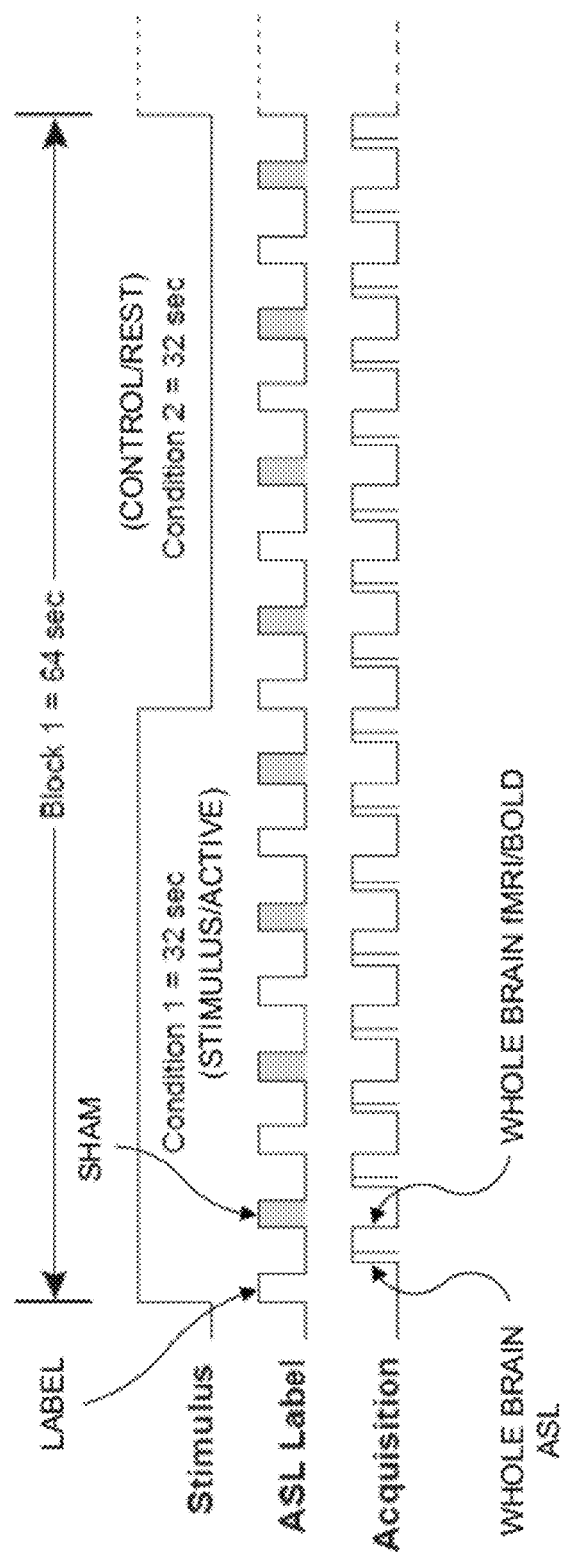
FIG. 1 is a timing diagram illustrating an example paradigm timing in some example methods of obtaining MRI image(s)

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

This disclosure is drawn, inter alia, to methods, systems, appliances and/or apparati related to obtaining magnetic resonance imaging (MRI) images from a subject under examination. More specifically, the disclosure relates to obtaining MRI images using arterial spin labeling (ASL) and blood-oxygen-level dependence functional magnetic resonance imaging (BOLD-fMRI) techniques.

The present disclosure contemplates that ASL functional imaging may provide several advantages over BOLD-fMRI. Task activation provided by ASL may show less inter-subject variability and/or ASL contrast may show more stable noise characteristics over the entire frequency spectrum, which may make it stable over periods of minutes. Functional changes detected by ASL may have superior spatial resolution. Simultaneous measurements of BOLD and ASL contrast may allow the estimation of cerebral blood flow (CBF) and/or cerebral metabolic rate of oxygen ($CMRO_2$), which may provide key information on neuronal activity as well as vascular coupling. While BOLD weighted ASL imaging may be possible, the requirement for relatively long echo times for a combined BOLD/ASL scan may not permit collection of whole brain images within the short time that the ASL label is inside the tissue. The present disclosure includes example methods for whole-brain, alternating ASL/BOLD fMRI and includes detailed example parameters and preliminary results associated with the use of such methods during a story listening task.

In some example embodiments, a method of obtaining one or more MRI images is provided. Some example methods may include providing ASL labeling, obtaining ASL acquisition(s) following the providing ASL labeling operation, and obtaining BOLD-fMRI acquisition(s) following the obtaining ASL acquisition operation.

In some example embodiments, a method of obtaining one or more MRI images is provided. Some example methods may include performing ASL labeling, acquiring an ASL multi-slice acquisition after a predetermined time delay period following the ASL labeling, and acquiring BOLD-fMRI multi-slice acquisition(s) after acquiring the ASL multi-slice acquisition.

In some example embodiments, a method of obtaining one or more magnetic resonance imaging (MRI) images is provided. Some example methods may include applying an ASL label pulse, acquiring ASL multi-slice acquisition(s) after a predetermined post-labeling time delay, acquiring BOLD-fMRI multi-slice acquisition(s) following the ASL multi-slice acquisition operation, and generating MRI image(s) based, at least in part, on the ASL multi-slice acquisition(s) and the BOLD-fMRI multi-slice acquisition(s).

In some example embodiments, simultaneous ASL/BOLD-fMRI may be implemented on a 3.0T MRI scanner using the body coil for RF pulse transmission and an 8 channel phased-array head coil for receive. The present disclosure contemplates that continuous ASL (CASL) may yield superior contrast-to-noise ratio compared with pulsed ASL (PASL) methods, but may not be practical with a body transmit coil. Spin labeling may be applied using a pulsed continuous arterial spin labeling approach (PCASL), since the RF duty cycle for the body coil may not permit continuous labeling. A post-labeling delay time of 1.5 s may be inserted after the end of the labeling/control pulses (which may also be 1.5 s in duration) to reduce transit artifact. The labeling plane may be placed approximately 8 cm below the imaging slices, at the level of the common carotid arteries.

FIG. 1 is a timing diagram illustrating an example of paradigm timing. In some example embodiments, an individual paradigm may run for approximately 6 minutes, 40 seconds (e.g., 6 blocks×64 seconds per block). An individual 64-second block may include two conditions (e.g., stimulus/active & control/rest), each of which may be about 32 seconds in duration. An individual 32 second condition may include 8 acquisitions (e.g., 4 ASL labeled and 4 sham labeled). ASL and fMRI/BOLD acquistions may occur in the same pulse. As shown in FIG. 1 of the "Acquisition" portion of the timeline, an acquisition pulse may include a "WHOLE BRAIN ASL" portion if the pulse, and a "WHOLE BRAIN fMRI/BOLD" portion of the pulse concurrently following the ASL portion. While FIG. 1 shows the fMRI/BOLD acquisition following the ASL acquisition, the fMRI/BOLD acquistion may occur prior to the ASL acquisition. FIG. 1 illustrates two acqusitions may concurrently occur in the same pulse.

Figure 2A:
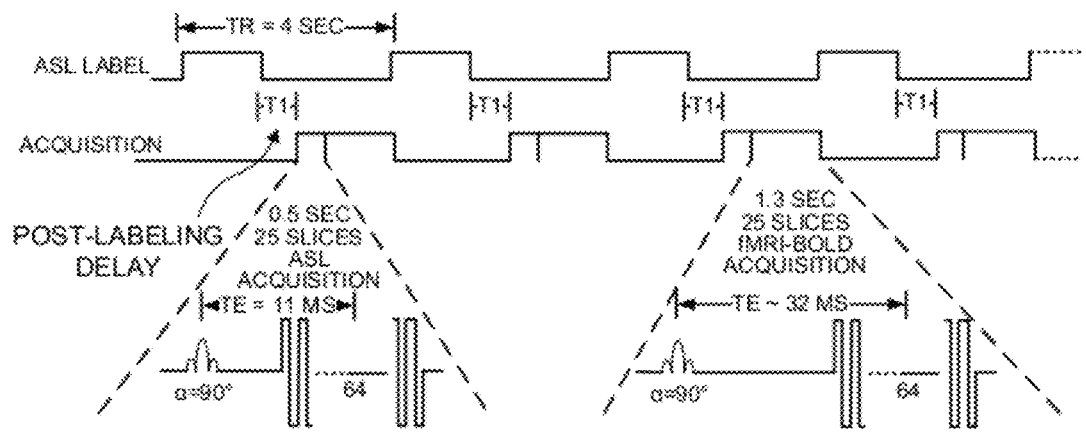
FIGS. 2A and 2B are timing diagrams illustrating example pulse sequence timing in some example methods of obtaining MRI image(s)

FIG. 2A is a timing diagram illustrating example pulse sequence timing. For example, an ASL label may be followed by an ASL acquisition (e.g., about 0.5 seconds for 25 slices) and then be concurrently followed by a BOLD-fMRI acquisition (e.g., about 1.3 seconds for 25 slices) within the same sequence. In some example embodiments, the repetition time (TR) for the ASL/BOLD-fMRI acquisitions may be about 4.0 seconds. Additional fMRI volumes can be added with a penalty of about 1.3 seconds per volume. In some exemplary embodiments, TI=700 msec (inversion time).

Figure 2B:
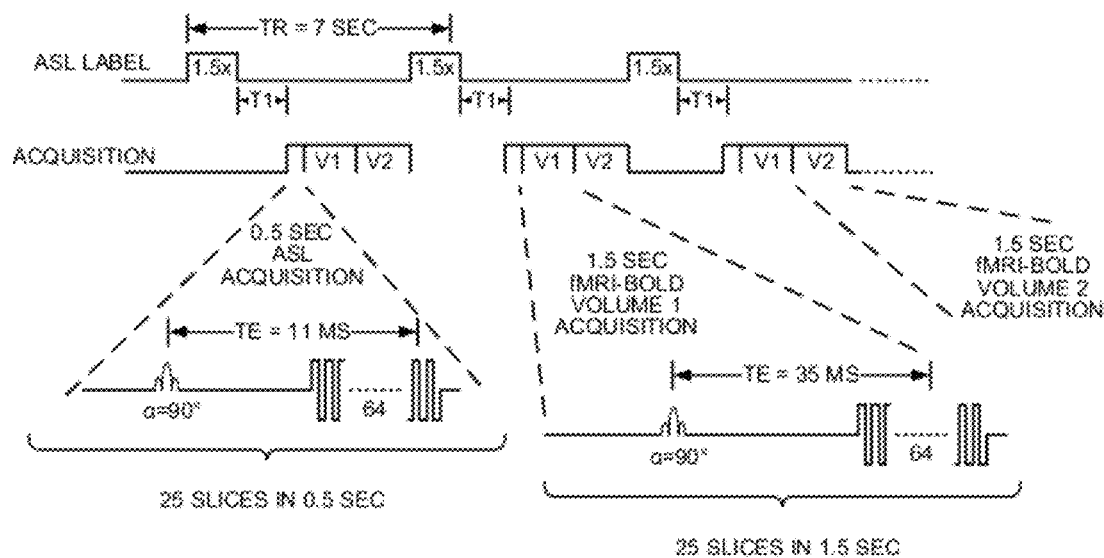

FIG. 2B is a timing diagram illustrating example pulse sequence timing. For example, an ASL label may be followed by an ASL acquisition (e.g., about 500 msec for 25 slices) and then followed by two fMRI/BOLD acquisitions (e.g., about 1.5 seconds for 25 slices for each volume) within the same sequence.

In some example embodiments, parameters for the ASL labeling may include: 1000 RF hanning pulses of 500 µs duration, 1.5 ms spacing between the RF pulses (for a total labeling duration of 1.5 s), Gmax=9 mT/m (maximum gradient amplitude), Gave=1 mT/m (average gradient amplitude), and/or average RF amplitude=1.7 µT. In some example methods, Gmax may be lowered to 6 mT/m without significantly reducing labeling efficiency, which may reduce acoustic gradient noise.

In some example embodiments, following the post-labeling delay, a single-shot EPI (echo planar imaging) acquisition may be performed with TE=11 msec (echo time) and total acquisition time for 25 slices of 500 msec, using a SENSE (sensitivity encoding) reduction factor of 2 and flip angle of 60 degrees. In some example embodiments, following the ASL acquisition, one or more additional image volumes may be acquired using single shot EPI with TE=32 msec, for BOLD contrast. In some example embodiments, TE=35 msec for the BOLD acquisitions.

An example embodiment was tested according to the following protocol. After testing the method on a phantom, human subjects were scanned with institutional review board approval and consent. A block-design story listening paradigm was administered during which subjects listened to a series of 5 short stories, each 60 seconds long, interleaved with 60 seconds of random tones. The total scan duration was therefore 10 minutes. The TR (repetition time) for each acquisition (during which an ASL and BOLD acquisition are obtained) was 5 s (so that 10 s was used for each label/control pair). Activation maps were computed from the ASL data and BOLD data separately using routines written in IDL (available from ITT Inc., Boulder, Colo.).

Figure 3:
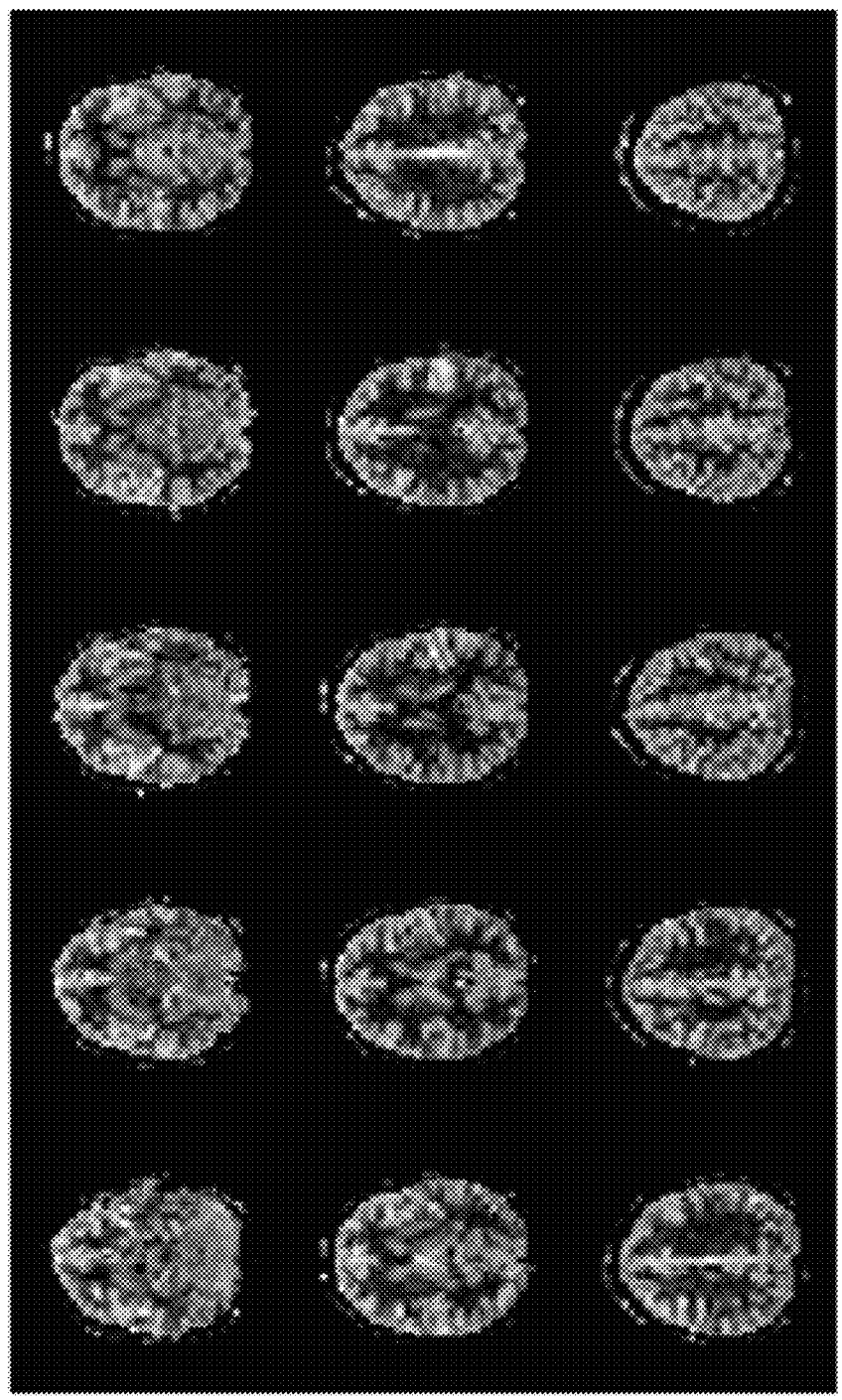
FIG. 3 is a diagram depicting baseline CBF maps in some example methods of obtaining MRI image(s)

In the test of the example embodiment, baseline CBF maps (FIG. 3) showed labeling efficiency of 90% and excellent contrast-to-noise in comparison with standard CASL (continuous arterial spin labeling) or PASL (pulsed arterial spin labeling) techniques. BOLD and ASL contrasts were obtained using a standard General Linear Model (GLM). BOLD contrast was obtained by using a standard square wave reference function, with a quadratic correction for baseline drift, and an ASL contrast function (0 for the labeled acquisition, 1 for the control acquisition) as a covariate of no interest. For the ASL contrast, pointwise estimates of relative CBF were obtained by surround subtraction and likewise filtering the BOLD contrast function (now used as a covariate of no interest) and the BOLD*ASL interaction term (used as the regressor of interest).

Figure 4:
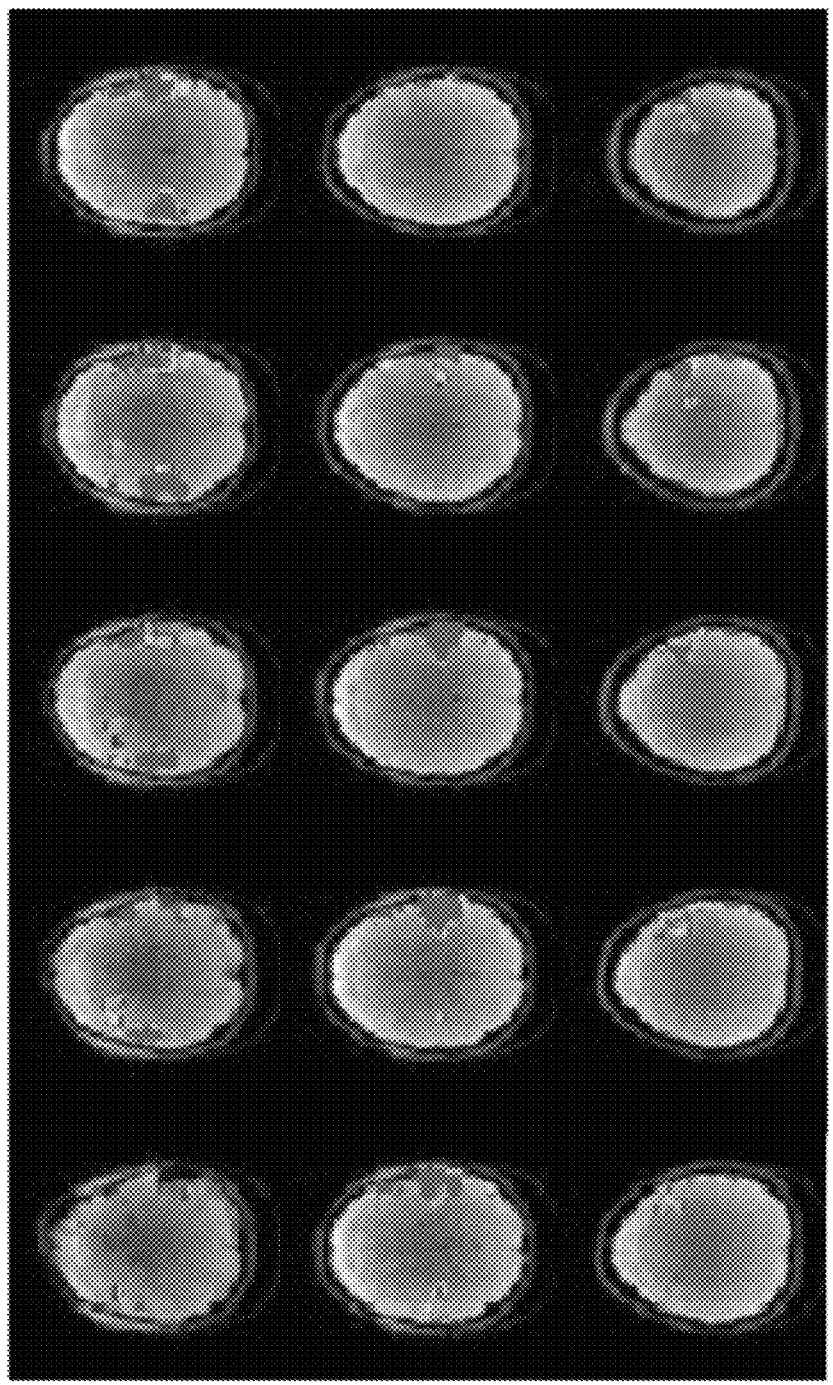
FIGS. 4 and 5 are diagrams depicting BOLD and ASL functional contrast maps in some example methods of obtaining MRI image(s)
Figure 5:
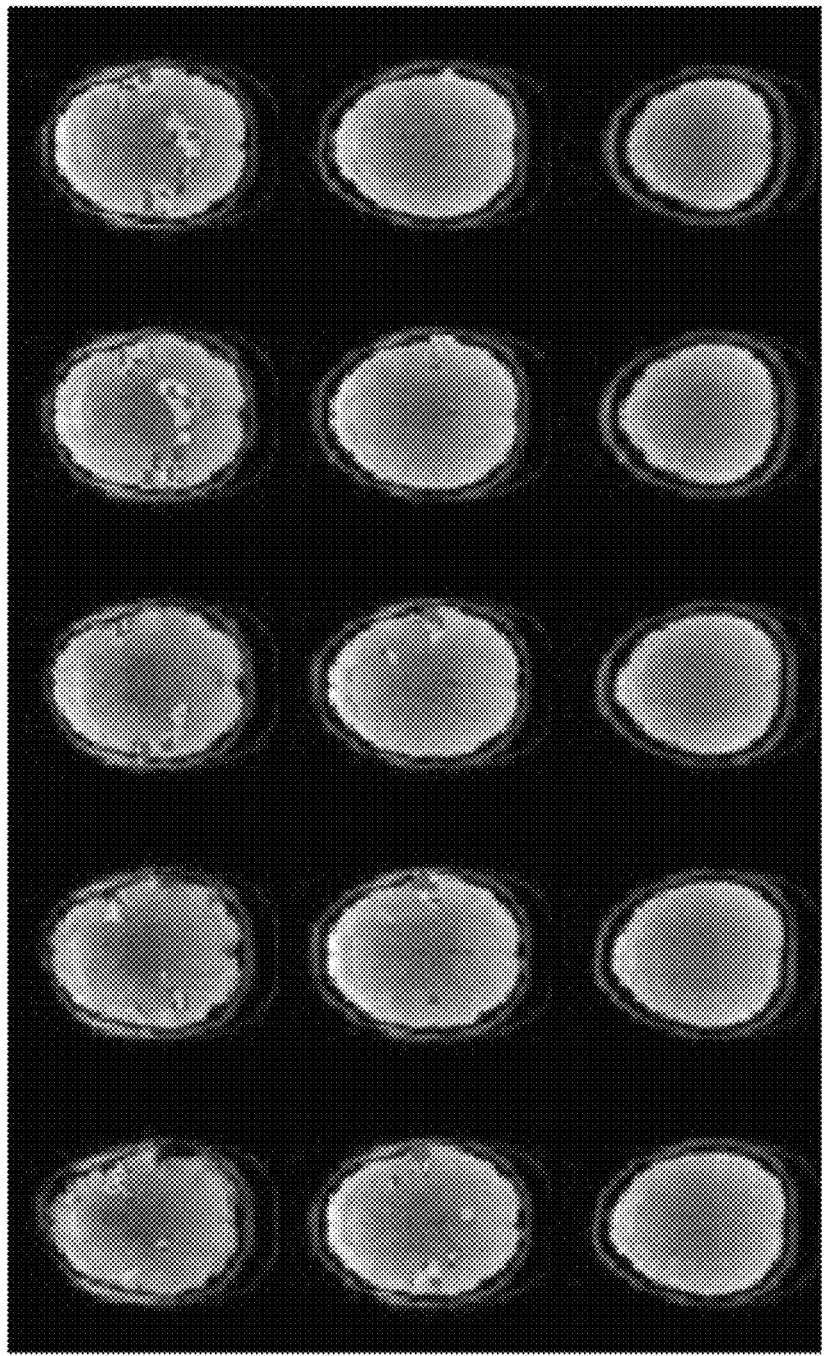

In the test of an example embodiment, both the BOLD and ASL functional contrast maps (FIGS. 4 and 5) demonstrate robust activation in Wernicke's areas (posterior STG (superior temporal gyrus)) bilaterally—the areas typically activated for this task. However, the activation maps also showed some differences. In FIG. 4, BOLD activation, but not ASL activation, was found in Broca's area. However, in the lingual gyri, only ASL but no BOLD activation was found in FIG. 5. Post-hoc ROI (region of interest) analyses verified in fact that no BOLD activation was present in the lingual gyrus, and that no significant ASL activation was present in Broca's area.

Referring to FIGS. 2A and 2B, an example method of obtaining MRI images may include a pulse sequence including (a) an ASL label pulse; (b) a post-labeling delay; (c) an ASL multi-slice acquisition; and (d) a BOLD multi-slice acquisition following the ASL multi-slice acquisition. In some example embodiments, the ASL label pulse may be about 1.5 seconds in duration. In some example embodiments, the ASL acquisition may be about 0.5 seconds in duration and/or may include about 25 slices. In some example embodiments, the BOLD acquisition may include one or two BOLD volume acquisitions of about 1.3-1.5 seconds each, which may include about 25 slices each. In some example embodiments, repetition time may be about 4-7 seconds. In some example embodiments, operations (a)-(d) may be repeated 8 times in a stimulus period and 8 times in a control period to form a block. In some example embodiments, the block may be repeated 6 times.

While the example methods illustrated in FIGS. 2A and 2B include ASL acquisition prior to BOLD acquisition, it is within the scope of the disclosure to perform one or more BOLD acquisitions before an ASL acquisition.

In some example embodiments, scans may be calibrated by causing hypercapnia and/or hyperoxia in the subject while the images are acquired. For example, under hypercapnia the maximum BOLD signal may be estimated since hypercapnia will produce the maximum amount of deoxyhemoglobin. From this information the relative change of cerebral metabolic rate of oxygen (CMRO2) may be estimated.

An examplary method may be implemented for simultaneous ASL/BOLD whole-brain acquisition at 3.0 T, using a PCASL technique. An advantage compared to two separate acquisitions is that it may be easier to tease apart CBF and non-CBF-related contributions to the BOLD signal because inter-scan variability may not be present. In addition, efficient timing of the stimulus may permit ASL and BOLD maps with good contrast to noise ratios to be obtained in under about 10 minutes. Robust functional contrast for both BOLD and ASL was shown for an adult subject performing a narrative comprehension task. However, there was not complete overlap between regions with ASL and regions with BOLD contrast. This may be related to regional differences in $CMRO_2$ changes and/or neuronal-vascular coupling. Using the combined ASL/BOLD technique, further research may be able to investigate these differences in more detail. Applications are anticipated, for example, in a normally developing cohort of children ranging in age from 0 to 18 years.

As used herein, "simultaneous" may refer to conditions and/or events that exist and/or occur at the same time (e.g., exactly coincident conditions and/or events), events and/or conditions that exist and/or occur substantially at the same time (e.g., substantially coincident conditions and/or events), and/or events and/or conditions that exist and/or occur sufficiently close in time that, for practical purposes, they may be considered to have occurred and/or existed at the same time.

Figure 6:
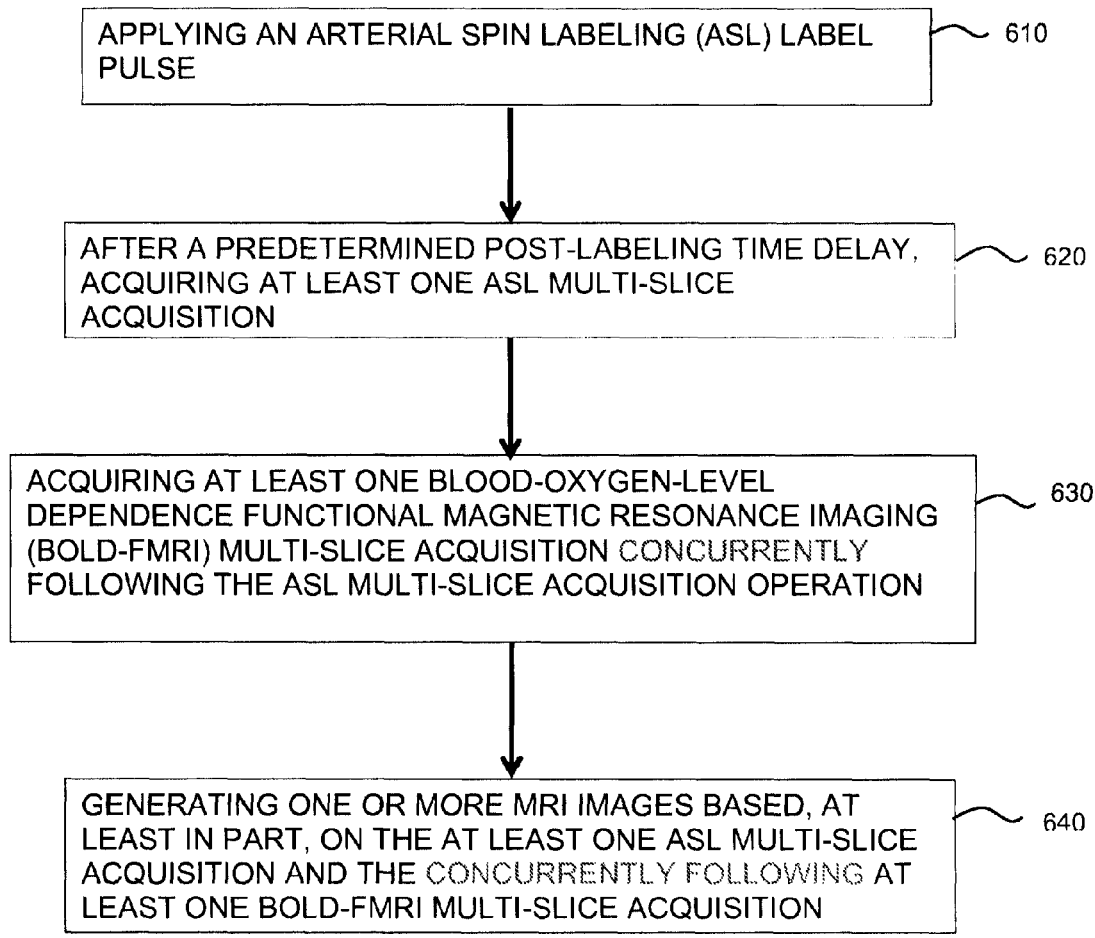
FIG. 6 is a flowchart depicting some example methods of obtaining MRI image(s)

FIG. 6 is a flowchart depicting an example method for obtaining MRI image(s) as may be controlled (in whole or in part) by a computer, a controller and/or a computerized system. At block 610, an ASL label pulse may be applied. Continuing to block 620, after a predetermined post-labeling time delay, at least one ASL multi-slice acquisition may be acquired. At block 630, following the ASL multi-slice acquisition operation, at least one BOLD-fMRI multi-slice acquisition may be acquired. At block 640, one or more MRI images may be generated based, at least in part, on the ASL multi-slice acquisition(s) and the BOLD-fMRI multi-slice acquisition(s). The example method depicted in FIG. 6 may be implemented in and/or controlled by a computer system and/or computing device as known to and available to those of ordinary skill (and/or as generally depicted in FIG. 7, for example).

Figure 7:
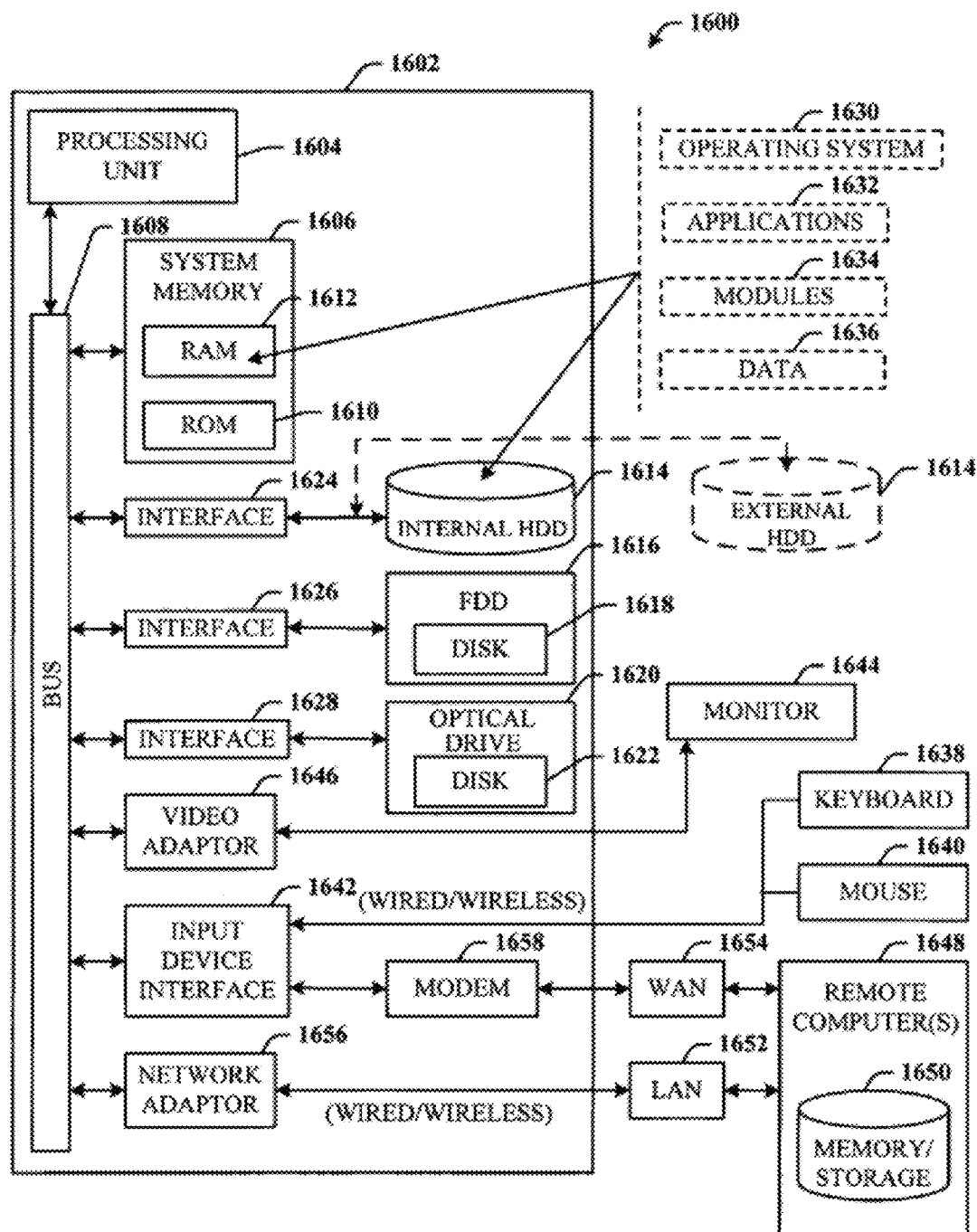
FIG. 7 is a diagram depicting some example computing environments for systems for use in some example methods of obtaining MRI image(s), all arranged in accordance with at least some embodiments of the present disclosure.

FIG. 7 illustrates an exemplary environment 1600 for implementing and/or controlling various aspects of an example system that includes a computer 1602, the computer 1602 including a processing unit 1604, a system memory 1606 and a system bus 1608. The system bus 1608 couples system components including, but not limited to, the system memory 1606 to the processing unit 1604. The processing unit 1604 can be any of various commercially available processors. Dual microprocessors and other multi-processor architectures may also be employed as the processing unit 1604.

The system bus 1608 can be any of several types of bus structure that may further interconnect to a memory bus (with or without a memory controller), a peripheral bus, and a local bus using any of a variety of commercially available bus architectures. The system memory 1606 includes read only memory (ROM) 1610 and random access memory (RAM) 1612. A basic input/output system (BIOS) is stored in a non-volatile memory 1610 such as ROM, EPROM, EEPROM, which BIOS contains the basic routines that help to transfer information between elements within the computer 1602, such as during start-up. The RAM 1612 can also include a high-speed RAM such as static RAM for caching data.

The computer 1602 further includes an internal hard disk drive (HDD) 1614 (e.g., EIDE, SATA), which internal hard disk drive 1614 may also be configured for external use in a suitable chassis (not shown), a magnetic floppy disk drive (FDD) 1616, (e.g., to read from or write to a removable diskette 1618) and an optical disk drive 1620, (e.g., reading a CD-ROM disk 1622 or, to read from or write to other high capacity optical media such as the DVD). The hard disk drive 1614, magnetic disk drive 1616 and optical disk drive 1620 can be connected to the system bus 1608 by a hard disk drive interface 1624, a magnetic disk drive interface 1626 and an optical drive interface 1628, respectively. The interface 1624 for external drive implementations includes at least one or both of Universal Serial Bus (USB) and IEEE 1394 interface technologies.

The drives and their associated computer-readable media provide nonvolatile storage of data, data structures, computer-executable instructions, and so forth. For the computer 1602, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of an example system.

A number of program modules can be stored in the drives and RAM 1612, including an operating system 1630, one or more application programs 1632, other program modules 1634 and program data 1636. All or portions of the operating system, applications, modules, and/or data can also be cached in the RAM 1612. It is appreciated that an example system can be implemented with various commercially available operating systems or combinations of operating systems.

A user can enter commands and information into the computer 1602 through one or more wired/wireless input devices, e.g., a keyboard 1638 and a pointing device, such as a mouse 1640. Other input devices (not shown) may include a microphone, an IR remote control, a joystick, a game pad, a stylus pen, touch screen, or the like. These and other input devices are often connected to the processing unit 1604 through an input device interface 1642 that is coupled to the system bus 1608, but can be connected by other interfaces, such as a parallel port, an IEEE 1394 serial port, a game port, a USB port, an IR interface, etc.

A monitor 1644 or other type of display device is also connected to the system bus 1608 via an interface, such as a video adapter 1646. In addition to the monitor 1644, a computer typically includes other peripheral output devices (not shown), such as speakers, printers, etc.

The computer 1602 may operate in a networked environment using logical connections via wired and/or wireless communications to one or more remote computers, such as a remote computer(s) 1648. The remote computer(s) 1648 can be a workstation, a server computer, a router, a personal computer, portable computer, microprocessor-based entertainment appliance, a peer device or other common network node, and typically includes many or all of the elements described relative to the computer 1602, although, for purposes of brevity, only a memory storage device 1650 is illustrated. The logical connections depicted include wired/wireless connectivity to a local area network (LAN) 1652 and/or larger networks, e.g., a wide area network (WAN) 1654. Such LAN and WAN networking environments are commonplace in offices, and companies, and facilitate enterprise-wide computer networks, such as intranets, all of which may connect to a global communication network, e.g., the Internet.

When used in a LAN networking environment, the computer 1602 is connected to the local network 1652 through a wired and/or wireless communication network interface or adapter 1656. The adaptor 1656 may facilitate wired or wireless communication to the LAN 1652, which may also include a wireless access point disposed thereon for communicating with the wireless adaptor 1656.

When used in a WAN networking environment, the computer 1602 can include a modem 1658, or is connected to a communications server on the WAN 1654, or has other means for establishing communications over the WAN 1654, such as by way of the Internet. The modem 1658, which can be internal or external and a wired or wireless device, is connected to the system bus 1608 via the serial port interface 1642. In a networked environment, program modules depicted relative to the computer 1602, or portions thereof, can be stored in the remote memory/storage device 1650. It will be appreciated that the network connections shown are exemplary and other means of establishing a communications link between the computers can be used.

The computer 1602 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

The following references may be relevant to the present disclosure and are incorporated by reference: Wong, E. G., R. B. Buxton, and L. R. Frank, A theoretical and experimental comparison of continuous and pulsed arterial spin labeling techniques for quantitative perfusion imaging. Magn Reson Med, 1998. 40(3): p. 348-55; Wang, J., et al., Amplitude-modulated continuous arterial spin-labeling 3.0-T perfusion MR imaging with a single coil: feasibility study. Radiology, 2005. 235(1): p. 218-28; Alsop, D. C. and J. A. Detre, Multisection cerebral blood flow MR imaging with continuous arterial spin labeling. Radiology, 1998. 208(2): p. 410-6; Alsop, D. C. and J. A. Detre, Reduced transit-time sensitivity in noninvasive magnetic resonance imaging of human cerebral blood flow. J Cereb Blood Flow Metab, 1996. 16(6): p. 1236-49; Wang, J., et al., Comparison of quantitative perfusion imaging using arterial spin labeling at 1.5 and 4.0 Tesla. Magn Reson Med, 2002. 48(2): p. 242-54; Ye, F. Q., et al., Noise reduction in 3D perfusion imaging by attenuating the static signal in arterial spin tagging (ASSIST). Magn Reson Med, 2000. 44(1): p. 92-100; Wang, Z., et al., Empirical optimization of ASL data analysis using an ASL data processing toolbox: ASLtbx. Magn Reson Imaging, 2008. 26(2): p. 261-9; Wang, J., et al., Empirical analyses of null-hypothesis perfusion FMRI data at 1.5 and 4 T. Neuroimage, 2003. 19(4): p. 1449-62; Aguirre, G. K., et al., Experimental design and the relative sensitivity of BOLD and perfusion fMRI. Neuroimage, 2002. 15(3): p. 488-500; Buxton, R. B., et al., A general kinetic model for quantitative perfusion imaging with arterial spin labeling. Magn Reson Med, 1998. 40(3): p. 383-96; Asllani, I., et al., An investigation of statistical power for continuous arterial spin labeling imaging at 1.5 T. Neuroimage, 2008. 39(3): p. 1246-56; Biagi, L., et al., Age dependence of cerebral perfusion assessed by magnetic resonance continuous arterial spin labeling. J Magn Reson Imaging, 2007. 25(4): p. 696-702; Detre, J. A., et al., Technical aspects and utility of fMRI using BOLD and ASL, Clinical Neurophysiology, 2002. 113: p. 621-634; Liu, T. T., et al., A signal processing model for arterial spin labeling functional MRI, NeuroImage, 2005. 24: p. 207-215; Hernandez-Garcia, L., et al., Quantitative analysis of arterial spin labeling FMRI data using a general linear model, Magnetic Resonance Imaging, 2010; Wang, J., et al., Arterial Spin Labeling Perfusion fMRI With Very Low Task Frequency, Magnetic Resonance in Medicine, 2003. 49: p. 796-802; and Woolrich, M. W., et al., Bayesian Interference of Hemodynamic Changes in Functional Arterial Spin Labeling Data, Magnetic Resonance in Medicine, 2006. 56: p. 891-906.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of obtaining one or more magnetic resonance imaging (MRI) images on a computerized system having a processor and non-transitory computer medium and operatively connected to an MRI scanner, the method comprising:
   providing arterial spin labeling (ASL) labeling;
   following the providing ASL labeling operation, obtaining at least one ASL acquisition using the MRI scanner; and
   following the obtaining ASL labeling operation, obtaining at least one blood-oxygen-level dependence functional magnetic resonance imaging (BOLD-fMRI) acquisition using the MRI scanner, wherein the ASL acquisition and the functional magnetic resonance imaging (BOLD-fMRI) acquisition are obtained concurrently in the same acquisition sequence;
   generating one or more MRI images based, at least in part, on the least one ASL acquisition and the leas one BOLD-fMRI acquisition
   displaying the one or more MRI images on a display.

2. The method of claim 1, wherein obtaining at least one ASL acquisition and obtaining at least one BOLD-fMRI acquisition occur substantially at concurrently within one or more individual pulses of the acquisition sequence.

3. The method of claim 1, wherein obtaining at least one ASL acquisition comprises obtaining at least one ASL multi-slice acquisition.

4. The method of claim 1, wherein obtaining at least one BOLD-fMRI acquisition comprises obtaining at least one BOLD-fMRI multi-slice acquisition.

5. The method of claim 1, wherein obtaining at least one BOLD-fMRI acquisition comprises obtaining two BOLD-fMRI acquisitions.

6. The method of claim 1, wherein at least one of:
   (a) obtaining at least one ASL acquisition and
   (b) obtaining at least one BOLD-fMRI acquisition comprises an acquisition of at least one whole-brain image.

7. The method of claim 1, wherein providing ASL labeling comprises at least one of:
   providing pulsed continuous arterial spin labeling,
   providing continuous arterial spin labeling, and
   providing pulsed arterial spin labeling.

8. A method of obtaining one or more magnetic resonance imaging (MRI) images on a computerized system having a processor and non-transitory computer medium and operatively connected to an MRI scanner, the method comprising:
   performing arterial spin labeling (ASL) with the computerized system and MRI scanner;
   acquiring an ASL multi-slice acquisition after a predetermined time delay period following the ASL labeling on the MRI scanner; and
   acquiring at least one blood-oxygen-level dependence functional magnetic resonance imaging (BOLD-fMRI)

multi-slice acquisition on the MRI scanner concurrently after acquiring the ASL multi-slice acquisition;

generating one or more MRI images based, at least in part, on the ASL multi-slice acquisition and the BOLD-fMRI multi-slice acquisition;

displaying the one or more MRI images on a display.

9. The method of claim 8, further comprising:

repeating the performing of an ASL labeling, the acquiring of the ASL multi-slice acquisition, and the acquiring of the BOLD-fMRI multi-slice acquisition during a stimulus period; and repeating the performing of an ASL labeling, the acquiring of the ASL multi-slice acquisition, and the acquiring of the BOLD-fMRI multi-slice acquisition during a control period.

10. The method of claim 9, further comprising:

comparing at least a portion of ASL multi-slice acquisitions and BOLD-fMRI multi-slice acquisitions acquired during the stimulus period with at least a portion of ASL multi-slice acquisitions and BOLD-fMRI multi-slice acquisitions acquired during the control period.

11. The method of claim 9, wherein the stimulus period and the control period are substantially as the same duration.

12. The method of claim 9, wherein a duration of the stimulus period is substantially 32 seconds; and wherein a duration of the control period is substantially 32 seconds.

13. The method of claim 9, wherein the stimulus period and the control period are the same duration.

14. The method of claim 9, wherein a duration of the stimulus period is 32 seconds; and wherein a duration of the control period is 32 seconds.

15. The method of claim 8, further comprising:

repeating the performing of an ASL labeling, the acquiring of the ASL multi-slice acquisition, and the acquiring of the BOLD-fMRI multi-slice acquisition during a first stimulus period;

repeating the performing of an ASL labeling, the acquiring of the ASL multi-slice acquisition, and the acquiring of the BOLD-fMRI multi-slice acquisition during a first control period;

repeating the performing of an ASL labeling, the acquiring of the ASL multi-slice acquisition, and the acquiring of the BOLD-fMRI multi-slice acquisition during a second stimulus period; and repeating the performing of an ASL labeling, the acquiring of the ASL multi-slice acquisition, and the acquiring of the BOLD-fMRI multi-slice acquisition during a second control period.

16. The method of claim 1, wherein at least one of:

(a) acquiring an ASL multi-slice acquisition and (b) acquiring an BOLD-fMRI multi-slice acquisition comprises acquiring a whole-brain image.

17. A method of obtaining one or more magnetic resonance imaging (MRI) images of a subject on a computerized system having a processor and non-transitory computer medium and operatively connected to an MRI scanner, the method comprising:

applying an arterial spin labeling (ASL) label pulse with the computerized system and MRI scanner;

after a predetermined post-labeling time delay, acquiring at least one ASL multi-slice acquisition on the MRI scanner;

acquiring at least one blood-oxygen-level dependence functional magnetic resonance imaging (BOLD-fMRI) multi-slice acquisition on the MRI scanner concurrently following the ASL multi-slice acquisition within the same acquisition sequence operation;

generating one or more MRI images based, at least in part, on the at least one ASL multi-slice acquisition and the at least one BOLD-fMRI multi-slice acquisition that occurred concurrently as part of the same acquisition sequence; and displaying the one or more MRI images on display.

18. The method of claim 17, wherein applying the ASL label pulse comprises applying the ASL label pulse for a duration of 1.5 seconds.

19. The method of claim 17, wherein acquiring at least one ASL multi-slice acquisition comprises acquiring at least one ASL multi-slice acquisition for a duration of 0.5 seconds.

20. The method of claim 17, wherein acquiring at least one ASL multi-slice acquisition comprises acquiring a plurality of slices.

21. The method of claim 17, wherein acquiring at least one ASL multi-slice acquisition comprises acquiring 25 slices.

22. The method of claim 17, wherein acquiring at least one BOLD-fMRI multi-slice acquisition comprises acquiring one BOLD-fMRI multi-slice acquisition over a duration of 1.3 seconds.

23. The method of claim 17, wherein acquiring at least one BOLD-fMRI multi-slice acquisition comprises acquiring two BOLD-fMRI multi-slice acquisition over a duration of 1.5 seconds for each of the two BOLD-fMRI multi-slice acquisitions.

24. The method of claim 17, wherein acquiring at least one BOLD-fMRI multi-slice acquisition comprises acquiring a plurality of slices.

25. The method of claim 17, wherein acquiring at least one BOLD-fMRI multi-slice acquisition comprises acquiring 25 slices.

26. The method of claim 17, further comprising:

repeating the applying of the ASL label, the acquiring of the at least one ASL multi-slice acquisition, and the acquiring of the at least one BOLD-fMRI multi-slice acquisition a plurality of times during a stimulus period of the acquisition sequence; and subsequently repeating the applying of the ASL label, the acquiring of the at least one ASL multi-slice acquisition, and the acquiring of at least one BOLD-fMRI multi-slice acquisition a plurality of times during a control period that concurrently follows said stimulus period of the acquisition sequence.

27. The method of claim 26, wherein the stimulus period and the control period form a block within the acquisition sequence; and wherein the block is repeated a plurality of times.

28. The method of claim 27, wherein the applying the ASL label, the acquiring the at least one ASL multi-slice acquisition, and the acquiring the at least one BOLD-fMRI multi-slice acquisition a plurality of times during a stimulus period are repeated at a period given by a repetition time, TR of the acquisition sequence.

29. The method of claim 28, wherein TR is in the range of 4 seconds to 7 seconds.

30. The method of claim 17, wherein at least one of:

(a) acquiring the at least one ASL multi-slice acquisition and (b) acquiring the at least one BOLD-fMRI multi-slice acquisition comprises acquiring at least one whole-brain image.

31. The method of claim 17, wherein the acquiring at least one ASL multi-slice acquisition operation further comprises monitoring at least one of hypercapnia and hyperoxia in a subject while at least a portion of the ASL multi-slice acquisition is acquired of the combined functional magnetic resonance imaging (BOLD-fMRI) multi-slice and ASL slice acquisition sequence.

32. The method of claim 31, further comprising:
estimating a relative change of cerebral metabolic rate of oxygen of the subject based, at least in part, on the ASL multi-slice acquisition acquired while monitoring the at least one of hypercapnia and hyperoxia.

33. The method of claim 17, wherein the acquiring at least one BOLD-fMRI multi-slice acquisition operation further comprises monitoring at least one of hypercapnia and hyperoxia in a subject while at least a portion of the BOLD-fMRI multi-slice acquisition is acquired of combined functional magnetic resonance imaging (BOLD-fMRI) multi-slice and ASL multi-slice acquisition sequence.

34. The method of claim 33, further comprising:
estimating a relative change of cerebral metabolic rate of oxygen of the subject based, at least in part, on the BOLD-fMRI multi-slice acquisition acquired while monitoring at least one of hypercapnia and hyperoxia.

* * * * *

UNITED STATES PATENT AND TRADEMARK OFFICE
CERTIFICATE OF CORRECTION

Page 1 of 1

PATENT NO. : 8,791,699 B2
APPLICATION NO. : 13/118943
DATED : July 29, 2014
INVENTOR(S) : Luis Hernandez-Garcia et al.

It is certified that error appears in the above-identified patent and that said Letters Patent is hereby corrected as shown below:

In the Specification:
Column 1,
After "STATEMENT REGARDING FEDERALLY SPONSORED RESEARCH OR DEVELOPMENT," lines 15-16, delete "This work may be supported in part by the National Institutes of Health grant number HHSN275200900018C." and insert -- This invention was made with government support under HHSN275200900018C awarded by the National Institutes of Health. The government has certain rights in the invention. --.

Signed and Sealed this
Twenty-first Day of October, 2014

Michelle K. Lee
*Deputy Director of the United States Patent and Trademark Office*